United States Patent
Uhler

(10) Patent No.: US 10,655,795 B2
(45) Date of Patent: May 19, 2020

(54) CONDUCTIVE DRIVER BOARD FOR LIGHT BULB

(71) Applicant: TECHNICAL CONSUMER PRODUCTS, INC., Aurora, OH (US)

(72) Inventor: George J. Uhler, Wadsworth, OH (US)

(73) Assignee: TECHNICAL CONSUMER PRODUCTS, INC., Aurora, OH (US)

( * ) Notice: Subject to any disclaimer, the term of this patent is extended or adjusted under 35 U.S.C. 154(b) by 0 days.

(21) Appl. No.: 16/146,773

(22) Filed: Sep. 28, 2018

(65) Prior Publication Data

US 2019/0101247 A1 Apr. 4, 2019

Related U.S. Application Data

(60) Provisional application No. 62/565,316, filed on Sep. 29, 2017.

(51) Int. Cl.
*F21K 9/235* (2016.01)
*H01R 33/22* (2006.01)
(Continued)

(52) U.S. Cl.
CPC ........... *F21K 9/235* (2016.08); *F21K 9/238* (2016.08); *H01R 12/72* (2013.01); *H01R 12/721* (2013.01);
(Continued)

(58) Field of Classification Search
CPC ....... F21K 9/235; F21K 9/238; H01R 12/721; H01R 33/225; H01R 12/72; H05K 1/117;
(Continued)

(56) References Cited

U.S. PATENT DOCUMENTS 5,989,070 A * 11/1999 Al-Turki ............... F21V 19/006
439/638
2013/0128573 A1 5/2013 Leung et al.
(Continued)

FOREIGN PATENT DOCUMENTS

| CN | 204477956 U | 7/2015 |
| CN | 204986912 U | 1/2016 |

OTHER PUBLICATIONS

PCT, U.S. Patent and Trademark Office (ISA/US), International Search Report and Written Opinion of the International Searching Authority, International Application No. PCT/US2018/053528, 7 pages, dated Dec. 13, 2018.

*Primary Examiner* — Donald L Raleigh
(74) *Attorney, Agent, or Firm* — Thompson Hine LLP

(57) ABSTRACT

A light bulb is disclosed, and includes a screw shell defining a cavity, a screw shell insulator, and a driver board. The screw shell insulator defines a passageway that terminates in an aperture. The driver board includes a positive leg that projects from a proximal edge of the driver board, with a proximal end portion that protrudes outside of the aperture, and a negative leg that projects from the proximal edge of the driver board, with a proximal end portion that is electrically connected to the screw shell. The positive leg is configured to extend through the passageway to make electrical contact with a positive terminal of a light socket. Variants in which a base shell and the legs are configured for bayonet type, multifaceted reflector, and T8-like bases are also disclosed.

19 Claims, 6 Drawing Sheets

(51) Int. Cl.
*H01R 12/72* (2011.01)
*F21K 9/238* (2016.01)
*H05K 1/11* (2006.01)

(52) U.S. Cl.
CPC ........... *H01R 33/225* (2013.01); *H05K 1/117* (2013.01); *H05K 2201/09145* (2013.01); *H05K 2201/1034* (2013.01); *H05K 2201/10257* (2013.01)

(58) Field of Classification Search
CPC .......... H05K 2201/10257; H05K 2201/09145; H05K 2201/1034
See application file for complete search history.

(56) References Cited

U.S. PATENT DOCUMENTS

| | | | |
|---|---|---|---|
| 2015/0062929 A1* | 3/2015 | Mostoller | F21K 9/00 362/363 |
| 2017/0074502 A1 | 3/2017 | Brnada et al. | |

\* cited by examiner

CONDUCTIVE DRIVER BOARD FOR LIGHT BULB

TECHNICAL FIELD

The present disclosure relates generally to a light bulb, and more particularly to a light bulb that includes a driver board having conductive contacts.

BACKGROUND

Light emitting diode (LED) based lighting systems may offer several energy and reliability advantages over other types of lighting systems such as, for example, incandescent or fluorescent lighting. Thus, LED based lighting systems are increasingly being used to replace other existing lighting technologies. An LED based light bulb mechanism may require contact engagement in order to transfer electrical current from a supply voltage to a driver board which provides current to the LEDs. Conventional LED based light bulbs typically utilize wires or precision formed mechanical contacts to transfer the supply or line voltage to the driver board.

The wires used to transfer current from the supply to the driver board are flexible. Since the wires are flexible, it may be challenging to align the wires during production using an automated assembly process. This is because flexible wires are difficult, if not impossible, to position the wires at a point of assembly in repetitive alignment. Accordingly, such wires are usually positioned and affixed manually by an operator during assembly. Using an operator to assemble the wiring with the light bulb is usually time consuming.

Alternatively, line voltage may be transferred to the driver board using mechanical contacts which are capable of being assembled to the screw shell by an automated process. However, such mechanical contacts contain several precision formed components, which are typically expensive and therefore add cost to the light bulb.

DETAILED DESCRIPTION

Figure 1:
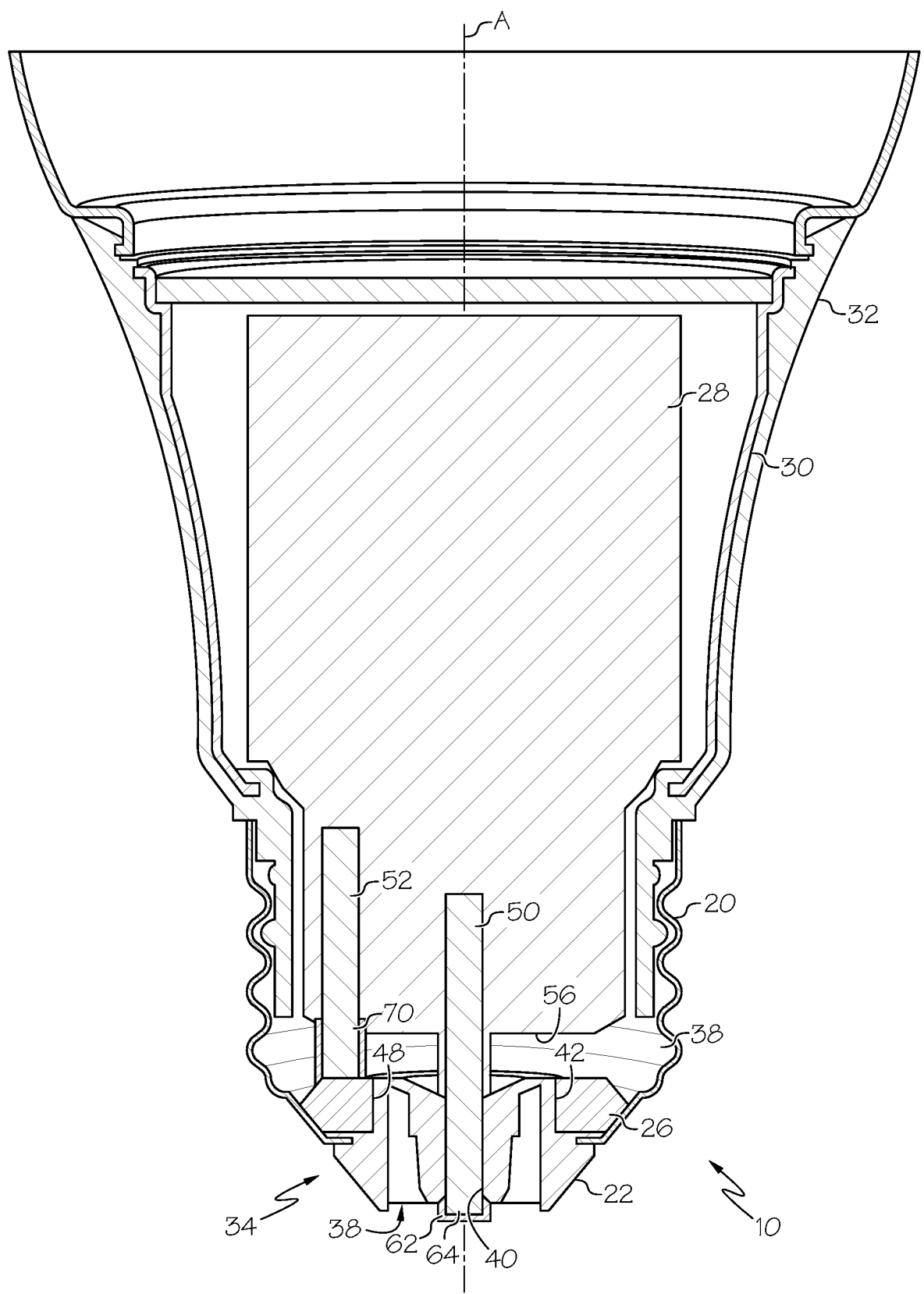
FIG. 1 is a cross-sectioned side view of the disclosed light bulb, where the light bulb includes a screw shell, screw shell insulator, a conductive foam insert, and a driver board having two legs.

The following detailed description will illustrate the general principles of the invention, examples of which are additionally illustrated in the accompanying drawings. In the drawings, like reference numbers indicate identical or functionally similar elements.

FIG. 1 is a cross-sectioned side view of an exemplary light bulb 10. The light bulb 10 includes a screw shell 20, a screw shell insulator 22, a conductive foam insert 26, a driver board 28, a housing 30, and an outer lamp body 32.

The screw shell 20 is located along a base 34 of the light bulb 10, and defines a threaded portion that is shaped to threadingly engage the light bulb 10 to a conventional light bulb socket (not shown). The screw shell 20 is not limited to the size and shape shown in FIG. 1, as screw shells are available in various sizes. In the embodiments as shown, the light bulb 10 is illustrated as a screw shell type light bulb 10. However, the disclosure is not limited to screw shell type light bulbs, and may be used with other lamps as well, such as, for example, bayonet, multifaceted reflector (MR), and linear T-type ((e.g., T2, T4, T5, and T8) style lamps. In such other embodiments, the illustrated screw shell 20 may represent a base shell or base portion of a bayonet, multifaceted reflector (MR), linear T-type, or other style lamp. It will be appreciated that in a bayonet type lamp the screw profile of the screw shell 20 may be replaced with a pair of oppositely disposed, laterally projecting lugs projecting outwardly from the base shell, and in a MR or T-type lamp the screw profile may be replaced with, e.g. a GU10 or T8 connector profile.

In one non-limiting embodiment, the light bulb 10 is a light emitting diode (LED) lamp. However, the disclosure is not limited to LED lamps. For example, in another embodiment the light bulb 10 may be an incandescent light bulb, a compact fluorescent lamp (CFL), a linear T-type fluorescent or LED lamp, or a gas-discharge lamp.

The screw shell 20 is constructed of an electrically conductive material such as, but not limited to, aluminum, nickel plated aluminum, copper, or brass. The screw shell 20, the screw shell insulator 22, and, preferably, a conductive foam insert 26 are all located at the base 34 of the light bulb 10. The screw shell 22 defines a cavity 38 that receives a portion of the driver board 28 and a portion of the screw shell insulator 22. The cavity 38 defined by the screw shell 20 may also receive the conductive foam insert 26. The screw shell insulator 22 is disposed at a rearmost or proximal portion 38 of the light bulb 10 and screw shell 20. The screw shell insulator 22 may be constructed of an electrically insulating material. Some examples of electrically insulating materials that may be used include glass or an electrically non-conductive polymer. In other embodiments, such as the aforementioned MR style lamps, the base shell 20 or base portion may be constructed of an electrically insulating material and include an integral or separate base shell or base insulator portion 22.

Figure 2:
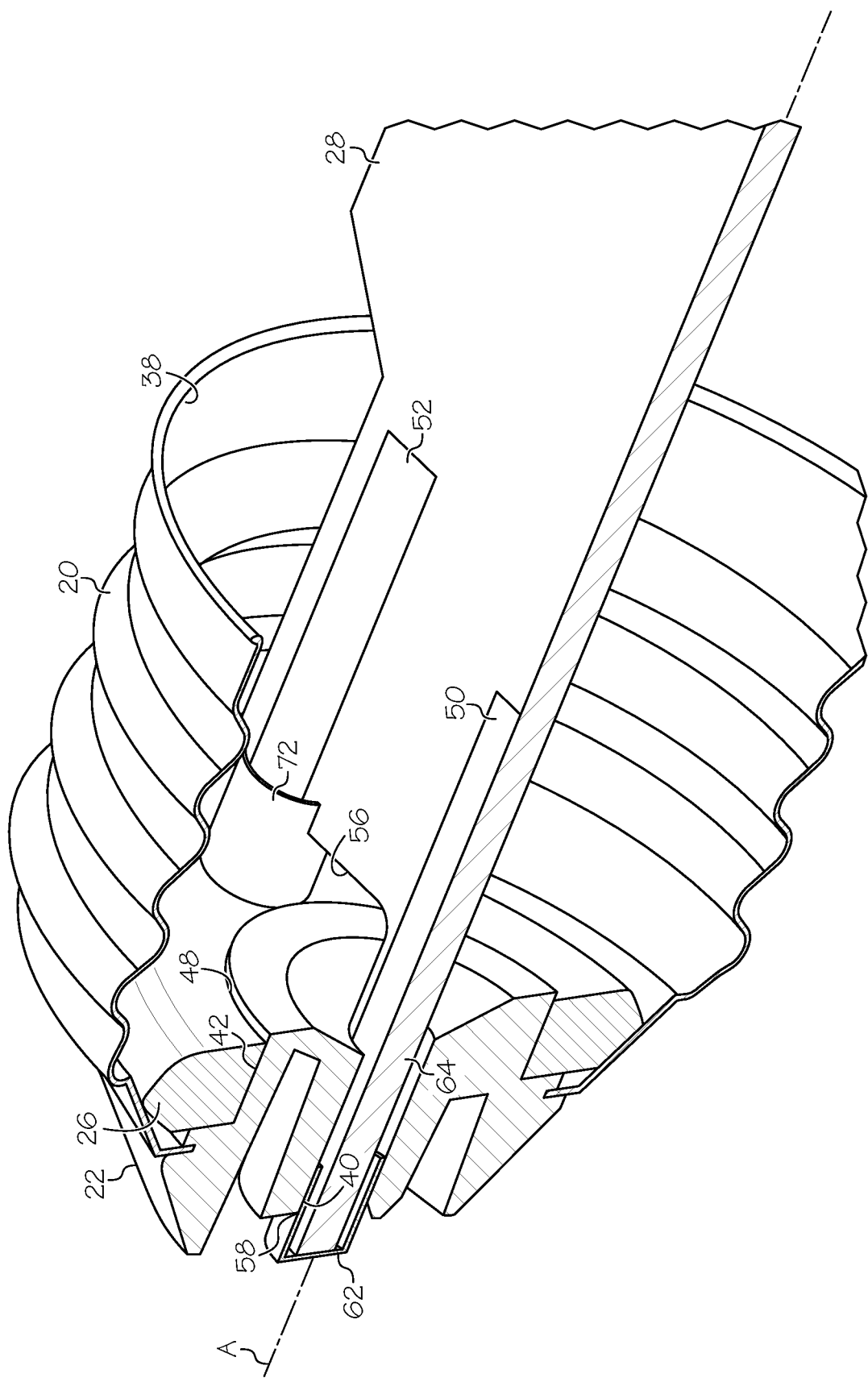
FIG. 2 is a cross-sectioned perspective view of a base of the light bulb shown in FIG. 1.
Figure 3:
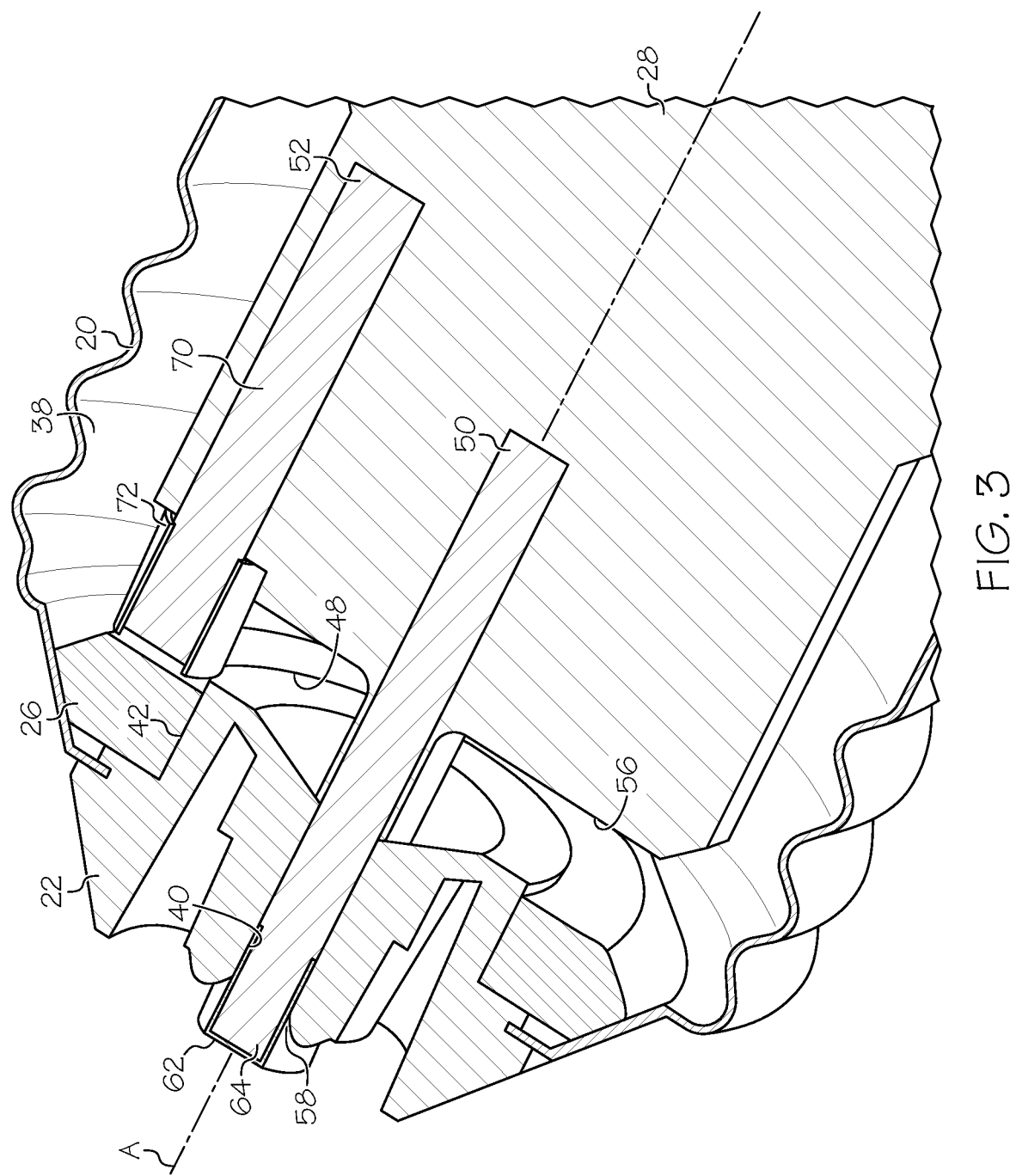
FIG. 3 is an enlarged cross-sectioned view of the base of the light bulb shown in FIGS. 1 and 2.

Referring now to FIGS. 1, 2, and 3, the screw shell insulator 22 defines a passageway 40 that extends along an axis of symmetry A-A of the light bulb 10 to an aperture 58. The screw shell insulator 22 may also define an annular ledge 42 that is shaped to receive the conductive foam insert 26. The conductive foam insert 26 may be constructed of an electrically conductive foam such as, but not limited to, polyurethane, silicone (sponge), fluorosilicone, fluorocarbon, neoprene (sponge), or EPDM (ethylene propylene diene monomer). The conductive foam insert 26 may be annular in shape such that an inner wall 48 surrounds the passageway 40.

The driver board 28 is a printed circuit board (PCB) that may include various power electronics (not illustrated) for providing power to a light emitting element (not illustrated). In one embodiment, the lighting element is one or more LEDs. Continuing to refer to FIGS. 1-3, the driver board 28 includes two legs 50, 52 that extend in a direction away from a rearmost or proximal edge 56 of the driver board 28. A positive leg 50 includes a positive conductor trace, and a negative leg 52 includes a negative conductor trace. Both legs 50, 52 may be shaped as an elongated rectangle, however the disclosure is not limited to this shape. Moreover, although the legs 50, 52 are illustrated as conductive traces, in another embodiment the legs 50, 52 may be constructed of or include a rigid wire instead.

As seen in FIGS. 2 and 3, the positive leg 52 is received by the passageway 40 of the screw shell insulator 22. Furthermore, the positive leg 52 of the driver board 28 extends past the aperture 48, which may be located along a rearmost or proximal terminal surface of the screw shell insulator 22. As explained below, a conductor cap 62 may be placed along a proximal end portion 64 of the positive leg 50. The conductor cap 62 protrudes from the opening 58 of the screw shell insulator 22 and creates a positive contact with a positive contact of a light bulb socket (not illustrated).

As seen in FIGS. 1-3, the negative leg 52 is situated at a position that is further away from the axis of symmetry A-A—of the light bulb 10. Accordingly, the proximal end portion 64 of the positive leg 50 of the driver board 28 is located further away from the proximal edge 56 of the driver board 28 when compared to a proximal end portion 70 of the negative leg 52 so as to contact the positive contact at the base of a conventional screw-type light bulb socket. The lengths of the legs 50, 52 are based on the specific requirements and geometry of a particular light bulb and corresponding light bulb socket. That is, the lengths of the legs 50, 52 may be adjusted to accommodate various packaging requirements for different types of light bulbs. For example, in another embodiment of the light bulb 10 the positive and negative legs 50, 52 are about equal in length. In other embodiments, such as the aforementioned MR style lamps, the base shell or base insulation portion 22 may include two passageways where both the positive and negative legs 50, 52 extend through respective passageways 40 so as to project beyond the base shell or base insulation portion 22.

Referring to FIGS. 2 and 3, the proximal end portion 70 of the negative leg 52 abuts or otherwise makes electrical contact the screw shell 20. Preferably, the proximal end portion 70 of the negative leg 52 abuts or otherwise contacts the conductive foam insert 26, which may be used to provide electrical contact to the screw shell 20, with the proximal end portion 70 of the negative leg 52 used to retain or secure the conductive foam insert 26 in place within the cavity 38 of the screw shell 20. Similar to the positive leg 50, a conductor cap 72 may also be placed at the proximal end portion 70 of the negative leg 52. In other embodiments, such as variants of the aforementioned MR style lamps, a base shell or base insulation portion may include a pair of embedded electrical contacts (not shown) that emerge within the cavity 38, where both the positive and negative legs 50, 52 abut the respective electrical contacts within the cavity 38. Preferably, the proximal end portions 62, 70 of the respective positive leg 50 and negative leg 52 abut or otherwise contact respective conductive foam inserts 26, which may be used to provide electrical contact to the respective electrical contacts within the cavity 38. The proximal end portions 62, 70 of the respective positive leg 50 and negative leg 52 may then be used to retain or secure the respective conductive foam inserts 26 in place within the cavity 38 of the base shell or base portion.

Figure 4:
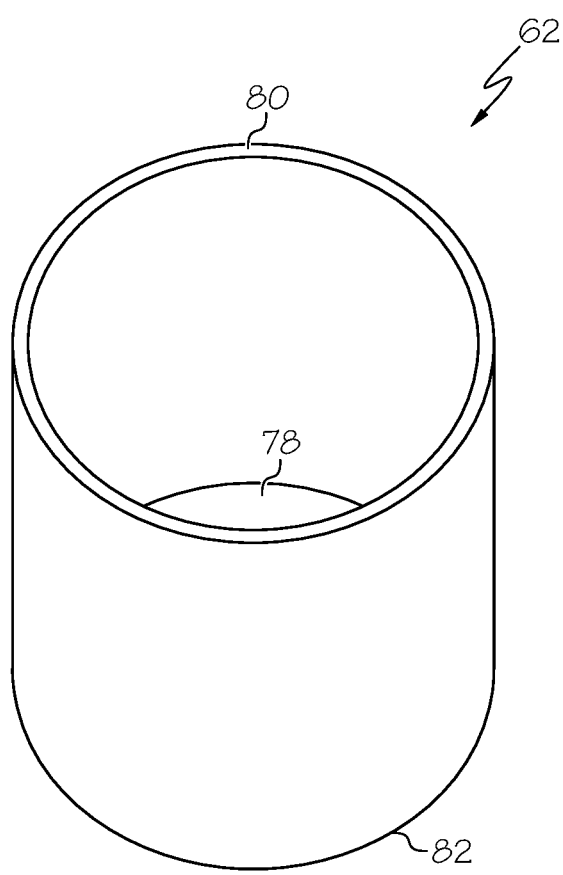
FIG. 4 is a perspective view of a conductor cap for engagement with one of the two legs of the driver board.
Figure 5:
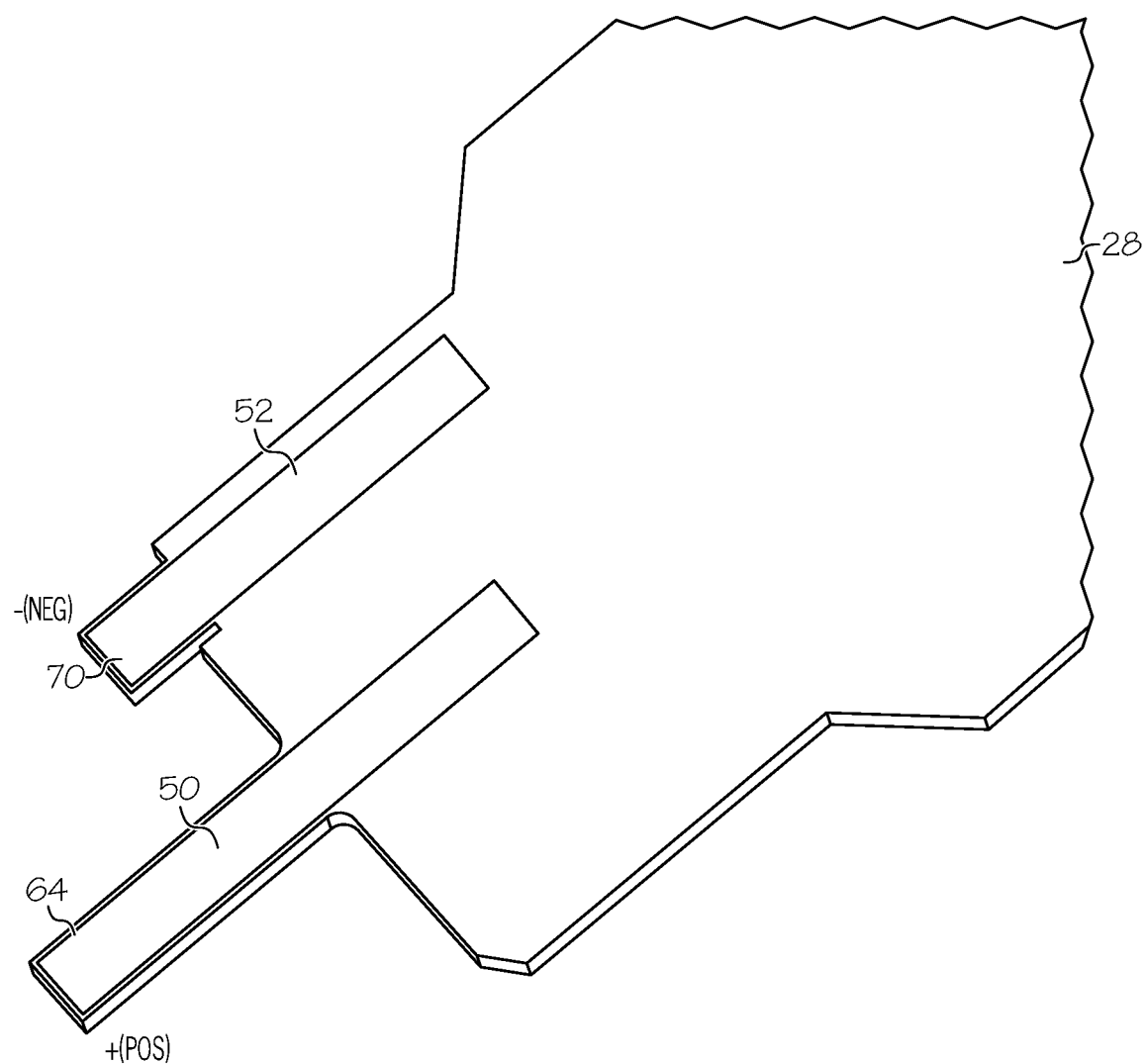
FIG. 5 is an illustration of the legs of the driver board, without the conductor caps shown in FIG. 4.
Figure 6:
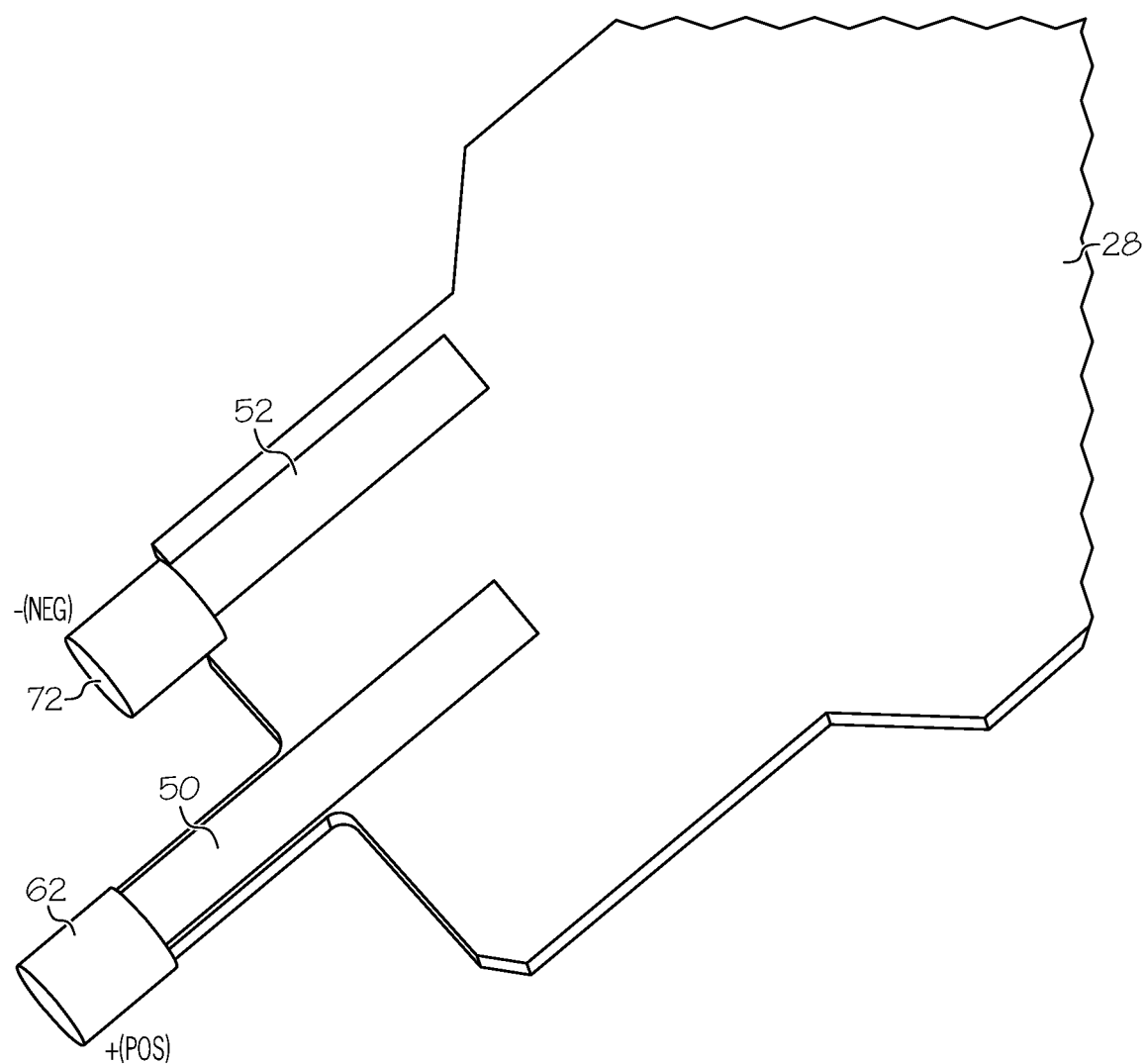
FIG. 6 is an illustration of the driver board shown in FIG. 5, with the conductor caps otherwise shown in FIG. 4.

FIG. 4 is a perspective view of the conductor cap 62. Although the conductor cap 62 is shown, it is to be appreciated that the conductor cap 72 may have an identical shape. The conductor caps 62, 72 are constructed of electrically conductive materials such as aluminum or copper. The conductor cap 62 includes a generally cylindrical profile defining a cavity 78, a first open end 80, and a second closed end 82. Referring now to FIGS. 3, 4, 5, and 6, the cavity 78 of the conductor cap 62 is shaped to receive the proximal end portion 64 of the positive leg 50. Similar to the conductor cap 62, the conductor cap 72 also includes a similar structure and is shaped to receive the proximal end portion 70 of the negative leg 52. The conductor caps 62, 72 may be attached to the respective legs 50, 52 by crimping, soldering, an electrically conductive adhesive, or other electrically conductive mechanical or chemical bond. The second closed end may be configured for use as pin connector in a bi-pin connector for an MR type or a linear T-type lamp.

In the illustrated example, as seen in FIGS. 2 and 3, the positive leg 50 of the driver board 28 is received by the passageway 40 of the screw shell insulator 22. The positive leg 50 of the driver board 28 also extends along a portion of the axis of symmetry A-A of the light bulb 10. The conductor cap 62 attached to the proximal end portion 64 of the leg 50 protrudes from the opening 58 of the screw shell insulator 22 and makes contact with a positive contact of a conventional light bulb socket (not illustrated). Moreover, the conductor cap 72 of the negative leg 52 of the driver board 28 is in electrical contact with the conductive foam insert 26, and the conductive foam insert 26 is in electrical contact with the screw shell 20. The electrical connection between the conductor cap 72, the conductive foam 26, and the screw shell 20 provides ground/negative electrical continuity.

Referring generally to the figures, the technical effects and benefits of the disclosed light bulb include a simple, cost effective approach for connecting a supply or line voltage to the driver board. Conventional light bulbs often employ flexible wiring or precision formed components to connect the line voltage to the driver board, which may result in increased process time, cost, and/or complexity of the light bulb. In contrast, the disclosed screw shell, insulator, conductive insert, and driver board may be assembled using an automated approach. Furthermore, the legs of the driver board also add simplicity to the overall design of the light bulb.

While the forms of apparatus and methods herein described constitute preferred embodiments of this invention, it is to be understood that the invention is not limited to these precise forms of apparatus and methods, and the changes may be made therein without departing from the scope of the invention.

What is claimed is:

1. A light bulb, comprising:
    a screw shell defining a cavity;
    a screw shell insulator located within the cavity, wherein the screw shell insulator defines a passageway that terminates in an aperture;
    a driver board including a coplanar positive leg that projects from a proximal edge of the driver board, wherein the positive leg defines a proximal end portion that protrudes outside of the aperture of the screw shell insulator, and a coplanar negative leg that projects from the proximal edge of the driver board, wherein the negative leg defines a proximal end portion that is electrically connected to the screw shell;
    wherein the positive leg is configured to extend through the passageway to make electrical contact with a positive terminal of a light socket.

2. The light bulb of claim 1, wherein the proximal end portion of the positive leg includes a conductor cap.

3. The light bulb of claim 1, comprising a conductive foam insert positioned in the cavity between the screw shell and the proximal end portion of the negative leg, wherein the proximal end portion of the negative leg abuts against the conductive foam insert.

4. The light bulb of claim 3, wherein the proximal end portion of the negative leg includes a conductor cap.

5. The light bulb of claim 3, wherein the screw shell insulator includes an annular ledge shaped to receive the conductive foam insert.

6. The light bulb of claim 5, wherein the conductive foam insert is annular in shape so as to surround the passageway.

7. The light bulb of claim 1, wherein the proximal end portion of the positive leg includes a conductor cap.

8. The light bulb of claim 1, wherein the coplanar positive leg comprises a substrate and a conductor trace.

9. The light bulb of claim 1, wherein the coplanar negative leg comprises a substrate and a conductor trace.

10. A light bulb, comprising:
a base shell defining a cavity;
a base shell insulator located within the cavity, wherein the base shell insulator defines at least one passageway that terminates in an aperture;
a driver board including a coplanar positive leg that projects from a proximal edge of the driver board, wherein the positive leg defines an proximal end portion that protrudes outside of the aperture of the base shell insulator, and a coplanar negative leg that projects from the proximal edge of the driver board, wherein the negative leg defines a proximal end portion that is electrically connected to the base shell or that protrudes outside of another aperture of a second passageway of the base shell insulator;
wherein at least the positive leg is configured to extend through the at least one passageway to make electrical contact with a positive terminal of a light socket.

11. The light bulb of claim 1, wherein the coplanar negative leg comprises a substrate and a conductor trace.

12. The light bulb of claim 10, wherein the coplanar positive leg comprises a substrate and a conductor trace.

13. The light bulb of claim 10, comprising a conductive foam insert positioned in the cavity between the base shell and the proximal end portion of the negative leg, wherein the proximal end portion of the negative leg abuts against the conductive foam insert.

14. The light bulb of claim 13, wherein the proximal end portion of the negative leg includes a conductor cap.

15. The light bulb of claim 13, wherein the base shell insulator includes an annular ledge shaped to receive the conductive foam insert.

16. The light bulb of claim 15, wherein the conductive foam insert is annular in shape so as to surround the at least one passageway.

17. The light bulb of claim 10, wherein the negative leg defines a proximal end portion that is electrically connected to the base shell, and the base shell includes a pair of oppositely disposed, laterally projecting lugs projecting outwardly from the base shell.

18. The light bulb of claim 10, wherein the negative leg is configured to extend through the second passageway to make electrical contact with a negative terminal of a light socket.

19. The light bulb of claim 18, wherein the proximal end portions of the positive and negative legs each includes a conductor cap, and the conductor caps are configured for use as a pin connector.

* * * * *